United States Patent
Lee

(10) Patent No.: US 9,679,639 B2
(45) Date of Patent: Jun. 13, 2017

(54) TWO PART PROGRAMMING AND ERASE METHODS FOR NON-VOLATILE CHARGE TRAP MEMORY DEVICES

(71) Applicant: SK hynix Inc., Icheon-si, Gyeonggi-do (KR)

(72) Inventor: Yeonghun Lee, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/040,175

(22) Filed: Feb. 10, 2016

(65) Prior Publication Data

US 2017/0076803 A1    Mar. 16, 2017

(30) Foreign Application Priority Data

Sep. 14, 2015 (KR) .................. 10-2015-0129935

(51) Int. Cl.
| | | |
|---|---|---|
| *G11C 11/56* | (2006.01) | |
| *G11C 16/14* | (2006.01) | |
| *G11C 16/34* | (2006.01) | |
| *G11C 16/26* | (2006.01) | |
| *G11C 16/08* | (2006.01) | |
| *G11C 16/04* | (2006.01) | |

(52) U.S. Cl.
CPC ...... *G11C 11/5628* (2013.01); *G11C 16/0483* (2013.01); *G11C 16/08* (2013.01); *G11C 16/14* (2013.01); *G11C 16/26* (2013.01); *G11C 16/349* (2013.01)

(58) Field of Classification Search
CPC ... G11C 16/0483; G11C 16/344; G11C 16/16; G11C 16/06; G11C 16/10; G11C 16/3454; G11C 16/3459; G11C 11/5628; G11C 16/3436; G11C 16/14; G11C 16/08; G11C 16/26; G11C 16/349
See application file for complete search history.

(56) References Cited

U.S. PATENT DOCUMENTS

| | | | | |
|---|---|---|---|---|
| 7,139,192 B1* | 11/2006 | Wong | .................. | G11C 11/5628 365/185.03 |
| 2008/0239828 A1* | 10/2008 | Lee | .................... | G11C 16/0483 365/185.29 |
| 2009/0303792 A1* | 12/2009 | Ho | ....................... | G11C 11/5628 365/185.03 |
| 2011/0051510 A1* | 3/2011 | Honma | .................. | G11C 16/10 365/185.03 |

(Continued)

FOREIGN PATENT DOCUMENTS

| | | |
|---|---|---|
| KR | 1020120066938 A | 6/2012 |
| KR | 1020130072083 A | 7/2013 |

*Primary Examiner* — Khamdan Alrobaie
*Assistant Examiner* — Ajay Ojha
(74) *Attorney, Agent, or Firm* — William Park & Associates Ltd.

(57) ABSTRACT

A semiconductor memory device includes a memory cell array including a plurality of memory cells, a peripheral circuit performing a program operation or erase operation of the memory cell array; and a control logic controlling the peripheral circuit. The control logic controls the peripheral circuit such that a first program allowable voltage applied to bit lines of the memory cell array during a first program operation of the program operation and a second program allowable voltage applied during a second program operation of the program operation are different from each other.

11 Claims, 12 Drawing Sheets

(56) References Cited

U.S. PATENT DOCUMENTS

| | | | |
|---|---|---|---|
| 2011/0080789 A1* | 4/2011 | Kalavade | G11C 11/5628 365/185.19 |
| 2012/0008407 A1* | 1/2012 | Park | G11C 16/0483 365/185.19 |
| 2012/0213005 A1* | 8/2012 | Lee | G11C 16/14 365/185.11 |
| 2012/0269001 A1* | 10/2012 | Ueno | G11C 16/14 365/185.22 |

* cited by examiner

TWO PART PROGRAMMING AND ERASE METHODS FOR NON-VOLATILE CHARGE TRAP MEMORY DEVICES

CROSS-REFERENCE TO RELATED APPLICATION

The present application claims priority under 35 U.S.C. §119(a) to Korean patent application number 10-2015-0129935, filed on Sep. 14, 2015, the entire disclosure of which is incorporated herein in its entirety by reference.

BACKGROUND

Field of Invention

Various embodiments of the present disclosure relate to an electronic device, and more particularly, to a semiconductor memory device and an operating method thereof.

Description of Related Art

A semiconductor memory device is a memory device realized using a semiconductor such as Si (silicon), Ge (germanium), GaAs (gallium arsenide), InP (indium phosphide), and the like. Semiconductor memory devices may be largely classified into volatile memory devices and nonvolatile memory devices.

A volatile memory device is a memory device from which stored data is erased once power supply is cut off. Examples of volatile memory devices include a SRAM (Static RAM), DRAM (Dynamic RAM), and SDRAM (Synchronous DRAM). A nonvolatile memory device is a memory device where stored data is retained even when the power supply is cut off. Examples of nonvolatile memory devices include a ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), and FRAM (Ferroelectric RAM). Flash memory devices may be classified into NOR type flash memory devices and NAND type flash memory devices.

BRIEF DESCRIPTION OF THE DRAWINGS

The above and other features and advantages of the present disclosure will become more apparent to those of ordinary skill in the art by describing in detail embodiments with reference to the attached drawings in which.

DETAILED DESCRIPTION

Figure 1:
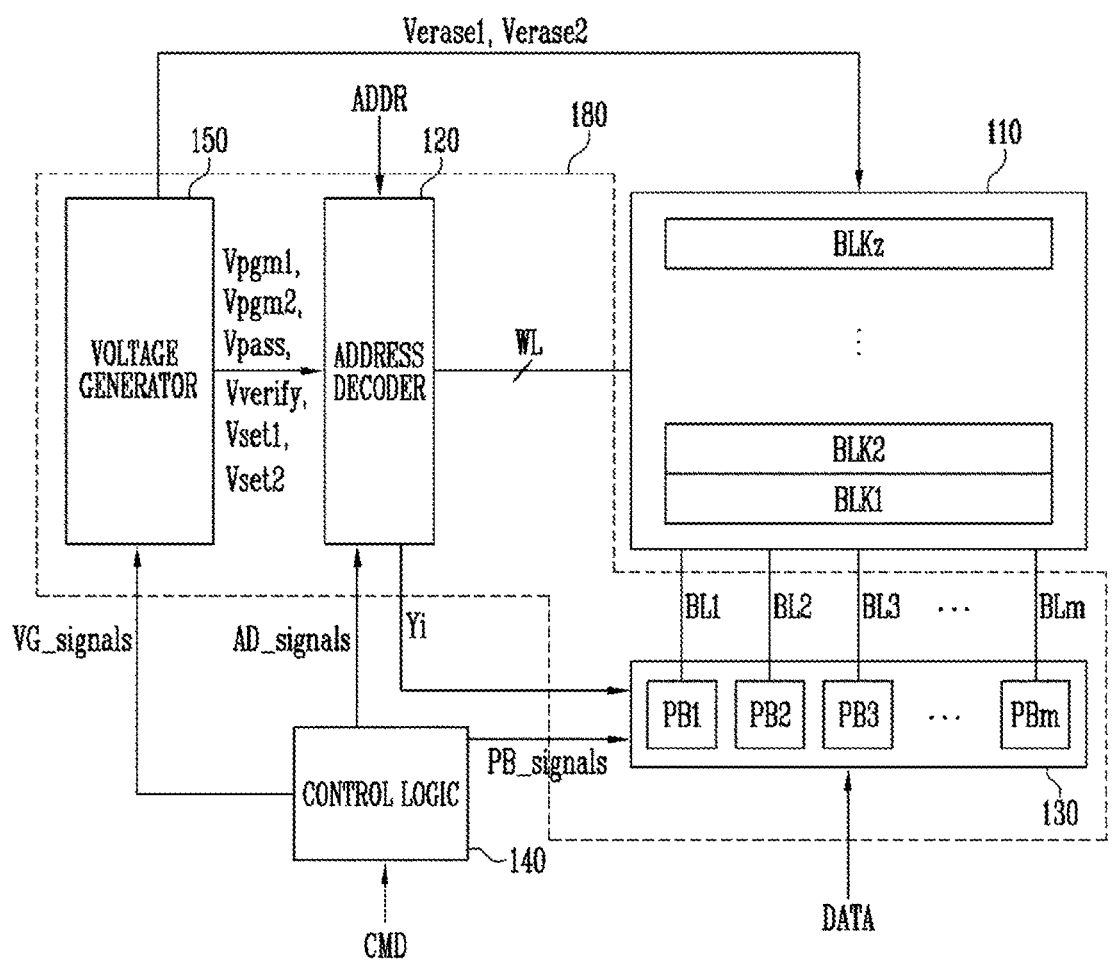
FIG. 1 is a block diagram for explaining a semiconductor memory device according to an embodiment of the present disclosure.

Various embodiments of the present disclosure are directed to provide a semiconductor memory device capable of improving the distribution of threshold voltages of memory cells during a program operation, and an operating method thereof.

According to an embodiment of the present disclosure, there is provided a semiconductor memory device including a memory cell array including a plurality of memory cells; a peripheral circuit configured to perform a program operation or erase operation of the memory cell array; and a control logic configured to control the peripheral circuit such that a first program allowable voltage applied to bit lines of the memory cell array during a first program operation of the program operation and a second program allowable voltage applied during a second program operation of the program operation are different from each other.

According to another embodiment of the present disclosure, there is provided a program operating method of a semiconductor memory device, the method including applying a first program allowable voltage to one or more bit lines of a memory cell array that includes a plurality of memory cells; applying a set program voltage to a word line selected among a plurality of word lines of the memory cell array; applying a second program allowable voltage to the one or more bit lines; and sequentially applying normal program voltages to the selected word line.

According to another embodiment of the present disclosure, there is provided an erase operation method of a semiconductor memory device, the method including applying a first erase control voltage to word lines of a memory cell array that includes a plurality of memory cells; applying a set erase voltage to a source line of the memory cell array; applying a second erase control voltage to the word lines; and sequentially applying normal erase voltages to the source line.

According to another embodiment of the present disclosure, there is provided a semiconductor memory device including a memory cell array that includes a plurality of memory cells; a peripheral circuit configured to perform a program operation and erase operation of the memory cell array; and a control logic configured to control the peripheral circuit to adjust a potential level or application time of a set program voltage applied to the memory cell array during a first program operation of the program operation according to a difference between a current temperature and a predetermined temperature of the semiconductor memory device.

According to another embodiment of the present disclosure, there is provided a semiconductor memory device including a memory cell array including a plurality of memory cells; a peripheral circuit configured to perform a program operation and erase operation of the memory cell array; and a control logic configured to control the peripheral circuit to adjust a potential level or application time of a set program voltage applied to the memory cell array during a first program operation of the program operation according to a difference between a current count of a program/erase cycle and a predetermined count of a program/erase cycle of the semiconductor memory device.

According to the various aforementioned embodiments of the present disclosure, it is possible to program the threshold voltages of the semiconductor memory device to be uniform by adjusting an initial program voltage and bit line potential level during a program operation of the semiconductor memory device.

Hereinafter, embodiments will be described in greater detail with reference to the accompanying drawings. Embodiments are described herein with reference to cross-sectional illustrations that are schematic illustrations of embodiments (and intermediate structures). As such, variations from shapes of the illustrations as a result of, for example, manufacturing techniques and/or tolerances, are to be expected. Thus, embodiments should not be construed as limited to the particular shapes or regions illustrated herein but may include deviations in shapes that result from, for example, manufacturing. In the drawings, lengths and sizes of layers and regions may be exaggerated for clarity. Like reference numerals in the drawings denote like elements.

Terms such as 'first' and 'second' may be used to describe various components, but these terms should not limit the various components. These terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, 'connected/accessed' represents that one component is directly connected to or accessed by another component or indirectly connected to or accessed through another component.

In this specification, a singular form may include a plural form as long as it is not specifically mentioned otherwise in a sentence. Furthermore, 'include/comprise' or 'including/comprising' used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meaning as would be construed in the context of the related art, and unless clearly defined otherwise in this specification, should not be construed as having idealistic or overly formal meanings.

FIG. 1 is a block diagram for explaining a semiconductor memory device according to the present disclosure.

Referring to FIG. 1, the semiconductor memory device 100 includes a memory cell array 110, address decoder 120, reading and writing circuit 130, control logic 140, and voltage generator 150.

The memory cell array 110 includes a plurality of memory blocks (BLK1~BLKz). The plurality of memory blocks (BLK1~BLKz) are connected to the address decoder 120 through word lines (WL). The plurality of memory blocks (BLK1~BLKz) are connected to the reading and writing circuit 130 through bit lines (BL1~BLm). Each of the plurality of memory blocks (BLK1~BLKz) includes a plurality of memory cells. In an embodiment, the plurality of memory cells may be nonvolatile memory cells, and more particularly, the plurality of memory cells may be nonvolatile memory cells based on a charge trap device. The memory cells connected to a same word line are defined as one page. That is, the memory cell array 110 includes a plurality of pages. Furthermore, each of the plurality of memory blocks (BLK1~BLKz) of the memory cell array 110 includes a plurality of strings. Each of the plurality of strings includes a drain selecting transistor connected in series between a bit line and a source line, a plurality of memory cells and a source selecting transistor.

The address decoder 120, reading and writing circuit 130, and voltage generator 150 operate as a peripheral circuit 180 that drives the memory cell array 110.

The address decoder 120 is connected to the memory cell array 110 through the word lines (WL). The address decoder 120 is configured to operate in response to control signals (AD_signals) output from the control logic 140. The address decoder 120 receives an address (ADDR) through an input/output buffer (not illustrated) inside the semiconductor memory device 100.

During a program operation, the address decoder 120 applies a set program voltage (Vpgm1), normal program voltage (Vpgm2) including a first normal program voltage and a second normal program voltage, and pass voltage (Vpass) generated in the voltage generator 150 to the plurality of word lines (WL) of the memory cell array 110. Furthermore, during an operation of verifying a program, the address decoder 120 applies a verify voltage (Vverify) and pass voltage (Vpass) generated in the voltage generator 150 to the plurality of word lines (WL) of the memory cell array 110. Furthermore, during an erase operation, the address decoder 120 applies a first erase control voltage (Vset1) or second erase control voltage (Vset2) generated in the voltage generator 150 to the plurality of word lines (WL) of the memory cell array 110.

A program operation of the semiconductor memory device 100 is performed in page units. An address (ADDR) received for a request of a program operation includes a block address, line address, and row address. The address decoder 120 selects one memory block and one word line according to the block address and line address. The row address (Yi) is decoded by the address decoder 120 and is provided to the reading and writing circuit 130.

An erase operation of the semiconductor memory device 100 may be performed in memory block units. The address (ADDR) received for a request of an erase operation includes a block address, and the address decoder 120 selects at least one memory block according to the block address.

The address decoder 120 may include a block decoder, line decoder, row decoder, and address buffer.

The reading and writing circuit 130 includes a plurality of page buffers (PB1~PBm). The plurality of page buffers (PB1~PBm) are connected to the memory cell array 110 through the bit lines (BL1~BLm). Each of the plurality of page buffers (PB1~PBm) temporarily stores data (DATA) input during a program operation, and controls a potential of each corresponding bit line (BL1~BLm) according to the temporarily stored data. Furthermore, the reading and writing circuit 130 controls the potentials of one or more of the bit lines (BL1~BLm) by setting a first program allowable voltage for a first program operation and a second program allowable voltage for a second program operation to be different from each other. For example, the first program allowable voltage may be set to have a lower potential than the second program allowable voltage where the first program operation will be performed before the second program operation.

The reading and writing circuit 130 operates in response to control signals (PB_signals) being output from the control logic 140.

The control logic 140 is connected to the address decoder 120, reading and writing circuit 130, and voltage generator 150. The control logic 140 receives a command (CMD) through the input/output buffer (not illustrated) of the semiconductor memory device 100. The control logic 140 is configured to control the overall operations of the semiconductor memory device 100 in response to the command (CMD).

The control logic 140 controls the reading and writing circuit 130 such that the program allowable voltage applied to one or more of the bit lines (BL1~BLm) during the first program operation is lower than the program allowable voltage applied to one or more of the bit lines (BL1~BLm) during the second program operation.

Furthermore, the control logic 140 controls the voltage generator 150 such that the set program voltage (Vpm1) generated during the first program operation and applied to the word lines (WL) has one or more of a higher potential level or a longer application time than the first normal program voltage (Vpgm2) applied to the word lines (WL) of the second program operation.

Furthermore, the control logic 140 controls the voltage generator 150 such that a first erase control voltage (Vset1) being applied to the word lines (WL) during a first erase operation of the erase operation is lower than a second erase control voltage (Vset2) being applied to the word lines (WL) during a second erase operation. The control logic 140 controls the voltage generator 150 such that a set erase voltage (Verase1) being applied to a source line of the memory cell array 110 during the first erase operation has at least one of a higher potential level or longer application time than a first normal erase voltage (Verase 2) of the second erase operation applied to the source line (SL) of the memory cell array 110.

The voltage generator 150 operates in response to control signals (VG_signals) output from the control logic 140.

The voltage generator 150 generates a set program voltage (Vpgm1), normal program voltage (Vpgm2), verify voltage (Vverify), and pass voltage (Vpass) during a program operation, but that the set program voltage (Vpgm1) being generated during the first program operation of the program operation has at least one of a higher potential level or longer application time than the first normal program voltage (Vpgm2) of the second program operation.

Furthermore, the voltage generator 150 generates a set erase voltage (Verase1) and normal erase voltage (Verase2) according to the control of the control logic 140 during an erase operation. The set erase voltage (Verase1) and first normal erase voltage (Verase2) generated during the erase operation are provided to memory blocks selected among the plurality of memory blocks (BLK1~BLKz) through the source line of the memory cell array 110. The voltage generator 150 generates the set erase voltage (Verase1) during the first operation of the erase operation such that the set erase voltage (Verase1) has at least one of a higher potential level or longer application time than the first normal erase voltage (Verase2) of the second erase operation.

Figure 2:
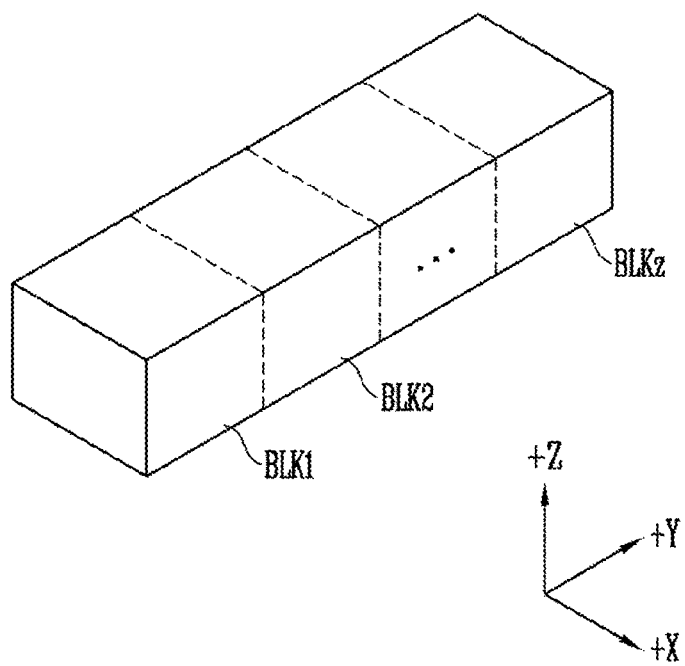
FIG. 2 is a block diagram illustrating an embodiment of a memory cell array of FIG. 1.

FIG. 2 is a block diagram illustrating an embodiment of the memory cell array 110 of FIG. 1

Referring to FIG. 2, the memory cell array 110 includes a plurality of memory blocks (BLK1~BLKz). Each of the memory blocks has a three-dimensional structure. Each of the memory blocks includes a plurality of memory cells deposited on top of a substrate. Such a plurality of memory cells are arranged in the +X direction, +Y direction, and +Z direction. The structure of each memory block will be explained in further detail with reference to FIG. 3 and FIG. 4.

Figure 3:
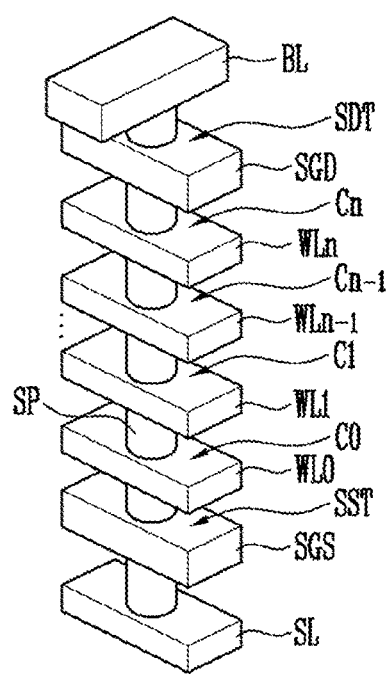
FIG. 3 is a three-dimensional view for describing a memory string included in a memory block according to the present disclosure.
Figure 4:
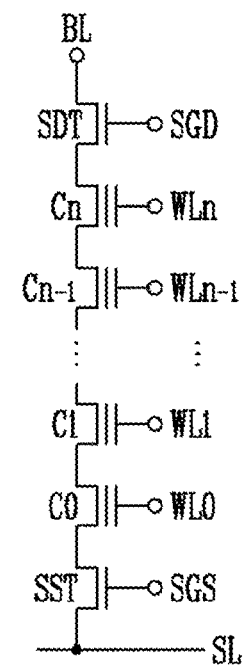
FIG. 4 is a circuit diagram for describing the memory string illustrated in FIG. 3.

FIG. 3 is a three-dimensional view for describing a memory string included in a memory block according to the present disclosure. FIG. 4 is a circuit diagram for describing the memory string.

Referring to FIG. 3 and FIG. 4, a source line (SL) is formed on a semiconductor substrate. On the source line (SL), a vertical channel layer (SP) is formed. An upper part of the vertical channel layer (SP) is connected to a bit line (BL). The vertical channel layer (SP) may be made of polysilicon. A plurality of conductive films (SGS, WL0~WLn, SGD) are formed to cover the vertical channel layer (SP) at different heights. On a surface of the vertical channel layer (SP), a multi-layered film (not illustrated) that includes a charge storage film is formed, and the multi-layered film is also disposed between the vertical channel layer (SP) and the conductive films (SGS, WL0~WLn, SGD). The multi-layered film may be formed in an ONO structure where an oxide film, a nitride film, and an oxide film are sequentially deposited.

A lowermost conductive film becomes a source selecting line (or first selecting line)(SGS), and an uppermost conductive film becomes a drain selecting line (or second selecting line)(SGD). Conductive films between the selecting lines (SGS, SGD) become word lines (WL0~WLn). In other words, on the semiconductor substrate, the conductive films (SGS, WL0~WLn, SGD) are formed in multiple layers, and a vertical channel layer (SP) penetrating the conductive films (SGS, WL0~WLn, SGD) is vertically connected between a bit line (BL) and a source line (SL) formed on the semiconductor substrate.

A drain selecting transistor (SDT) is formed where the uppermost conductive film (SGD) covers the vertical channel layer (SP), and a source selecting transistor (SST) is formed where the lowermost conductive film (SGS) covers the vertical channel layer (SP). Further, memory cells (C0~Cn) are formed where intermediate conductive films (WL0~WLn) cover the vertical channel layer (SP).

By the aforementioned structure, the memory string includes the source selecting transistor (SST) that is vertically connected to the substrate, memory cells (C0~Cn) and drain selecting transistor (SDT) between the source line (SL) and bit line (BL). The source selecting transistor (SST) electrically connects the memory cells (C0~Cn) to the source line (SL) according to a first selecting signal being applied to the first selecting line (SGS). The drain selecting transistor (SDT) electrically connects the memory cells (C0~Cn) to the bit line (BL) according to a second selecting signal being applied to a second selecting line (SGD).

Figure 5:
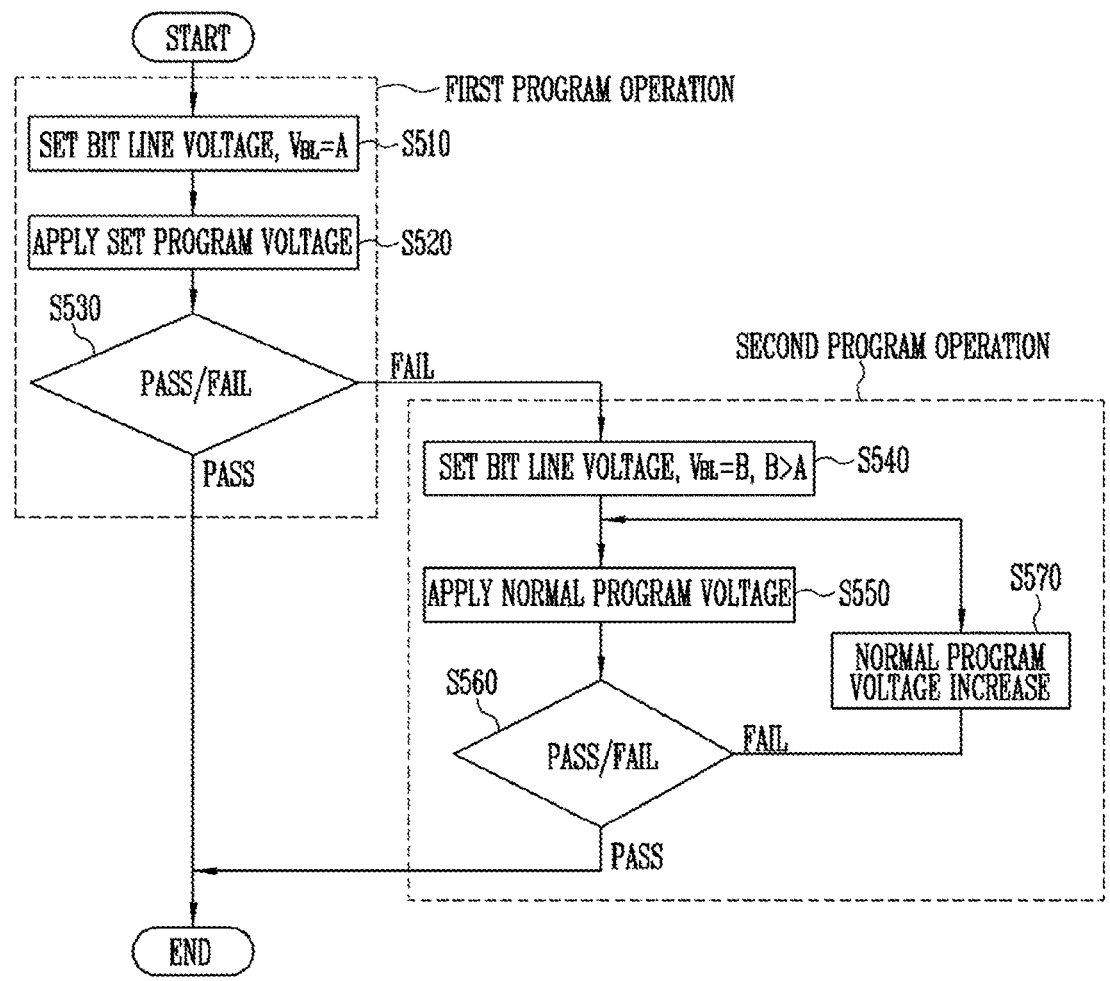
FIG. 5 is a flowchart for describing a program operation according to an embodiment of the present disclosure.

FIG. 5 is a flowchart for describing a program operation according to an embodiment of the present disclosure.

Figure 6:
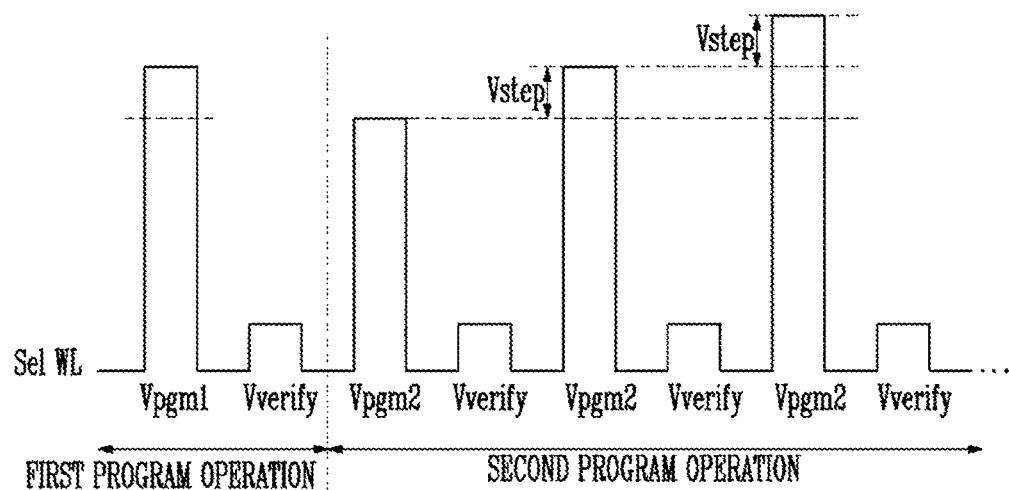
FIG. 6 is a voltage waveform diagram for describing a method of applying a program voltage according to an embodiment of the present disclosure.

FIG. 6 is a voltage waveform diagram for describing a method for applying a program voltage according to an embodiment of the present disclosure.

Figure 7:
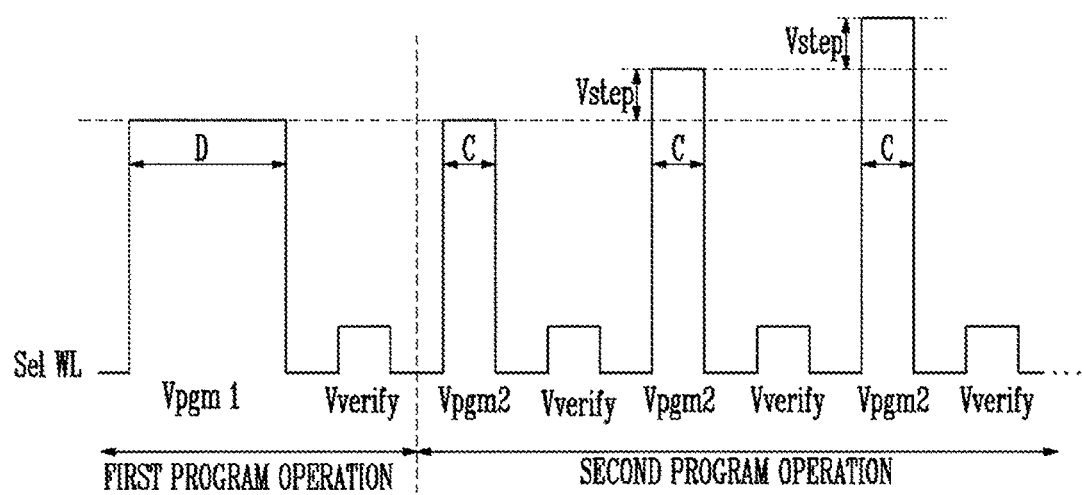
FIG. 7 is a voltage waveform diagram for describing a method of applying a program voltage according to another embodiment of the present disclosure.

FIG. 7 is a voltage waveform diagram for describing a method for applying a program voltage according to another embodiment of the present disclosure.

Figure 8:
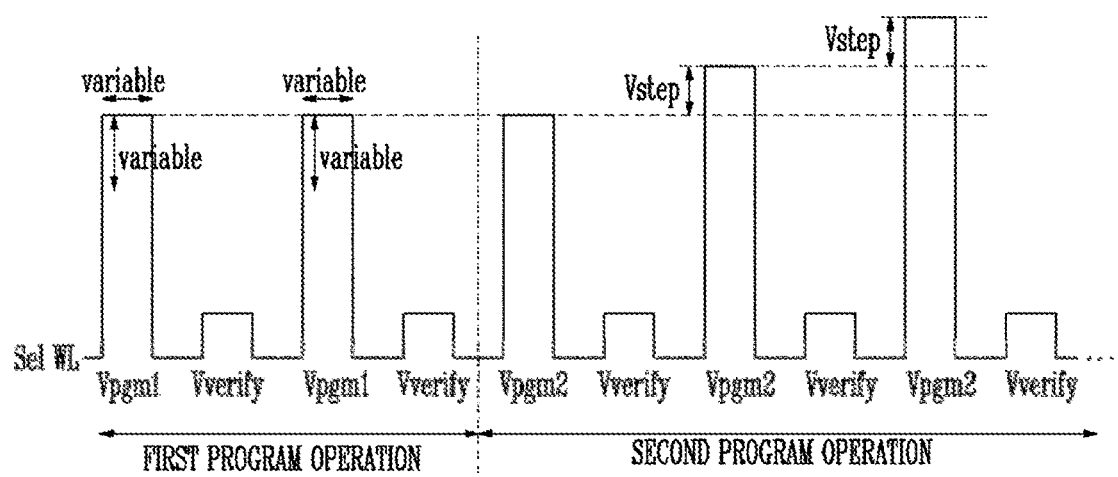
FIG. 8 is a voltage waveform diagram for describing a method of applying a program voltage according to another embodiment of the present disclosure.

FIG. 8 is a voltage waveform diagram for describing a method for applying a program voltage according to another embodiment of the present disclosure.

Referring to FIGS. 1 to 8, a program operation method of a semiconductor memory device according to the present disclosure will be described.

A program operation of a semiconductor memory device according to an embodiment of the present disclosure may include a first program operation and a second program operation.

The first program operation includes a step of setting a bit line voltage (S510), a step of applying a set program voltage (S520), and a step of verifying a program (S530).

1) Setting Bit Line Voltage (S510)

When a command (CMD) associated with a program operation is input, the control logic 140 controls the reading and writing circuit 130 to temporarily store program data (DATA) input to the plurality of page buffers (PB1~PBm).

The plurality of page buffers (PB1~PBm) control a potential level of a corresponding bit line according to the temporarily stored program data (DATA). That is, the plurality of page buffers (PB1~PBm) applies a program ban voltage or program allowable voltage to the corresponding bit line according to the temporarily stored program data (DATA). The program allowable voltage used in the first program operation is defined as A. The program allowable voltage (A) used in the first program operation has a lower potential level than the program allowable voltage (B) used in the second program operation to be explained later on. The program allowable voltage (A) may be a negative voltage.

2) Applying Set Program Voltage (S520)

The control logic 140 controls the voltage generator 150 to generate a set program voltage (Vpgm). The address decoder 120 applies the set program voltage (Vpgm1) generated, by the voltage generator 150, to a word line selected among the plurality of word lines (WL).

As illustrated in FIG. 6, the set program voltage (Vpgm1) applied to the selected word line during the first program operation may have a higher potential level than a first occurrence of the first normal program voltage (Vpgm2) applied during the second program operation.

Furthermore, as in FIG. 7, an application time (D) of the set program voltage (Vpgm1) applied during the first program operation may be longer than an application time (C) of the first normal program voltage (Vpgm2) applied during the second program operation.

As illustrated in FIG. 8, it is possible to vary the potential level and application time of the set program voltage (Vpgm1) applied during the first program operation such that set program voltage (Vpgm1) has at least one of a higher potential level and longer application time than the first normal program voltage (Vpgm2) applied during the second program operation.

While the set program voltage (Vpgm1) is applied to the selected word line, a pass voltage (Vpass) is applied to the remaining unselected word lines.

3) Verify Program (S530)

When the application of the set program voltage (S520) is completed, the control logic 140 controls the voltage generator 150 to generate a verify voltage (Vverify). The address decoder 120 applies the verify voltage (Vverify) generated by the voltage generator 150 to the word line selected among the plurality of word lines (WL).

While the verify voltage (Vverify) is applied, the plurality of page buffers (PB1~PBm) sense potential levels of the corresponding bit lines (BL1~BLm) and performs a verify operation.

While the verify voltage (Vverify) is applied to the selected word line, a pass voltage (Vpass) is applied to the remaining unselected word lines.

The second program operation includes a step of setting a bit line voltage (S540), a step of applying a normal program voltage (S550), a step of verifying a program (S560), and a step of increasing a normal program voltage (S570).

4) Setting Bit Line Voltage (S540)

When a result of the aforementioned step of verifying a program of the first program operation (S530) is determined as a failure, the plurality of page buffers (PB1~PBm) control a potential level of a corresponding bit line according to the temporarily stored program data (DATA). That is, each of the plurality of page buffers (PB1~PBm) either applies a program ban voltage or a program allowable voltage to the corresponding bit line according to the temporarily stored program data (DATA). The program allowable voltage used in the second program operation is defined as B. The program allowable voltage (B) used in the second program operation has a higher potential level than the program allowable voltage (A) used in the first program operation aforementioned.

5) Applying Normal Program Voltage (S550)

The control logic 140 controls the voltage generator 150 to generate a normal program voltage (Vpgm2). The normal program voltage (Vpgm2) generated in the voltage generator 150 is applied to a word line selected among the plurality of word lines (WL) by the address decoder 120. Herein, the generated normal program voltage (Vpgm2) may have a lower potential level or shorter voltage application time than the set program voltage (Vpgm1) applied to the selected word line during the first program operation.

While the normal program voltage (Vpgm2) is applied to the selected word line, a pass voltage (Vpass) is applied to the remaining unselected word lines.

6) Verifying Program (S560)

When the aforementioned step of applying a normal program voltage (S550) is completed, the control logic 140 controls the voltage generator 150 to generate a verify voltage (Vverify). The verify voltage (Vverify) generated in the voltage generator 150 is applied to the word line selected among the plurality of word lines (WL) by the address decoder 120.

While the verify voltage (Vverify) is applied, the plurality of page buffers (PB1~PBm) sense the potential levels of the corresponding bits lines (BL1~BLm) and performs a verify operation.

While the verify voltage (Vverify) is being applied to the selected word line, a pass voltage (Vpass) is applied to the remaining unselected word lines.

7) Increase of Normal Program Voltage (S570)

When a result of the aforementioned step of verifying a program (S560) is determined as a failure, the control logic 140 sets a new normal program voltage (Vpgm2) that is increased by as much as a step voltage (Vstep) more than the normal program voltage (Vpgm2) used in the previous step of applying a normal program voltage (S550), and controls the peripheral circuit 180 to re-perform starting from the aforementioned step of applying a normal program (S550). As such, the normal program voltage (Vpgm2) may be sequentially applied to word line selected among the plurality of word lines (WL).

Figure 9:
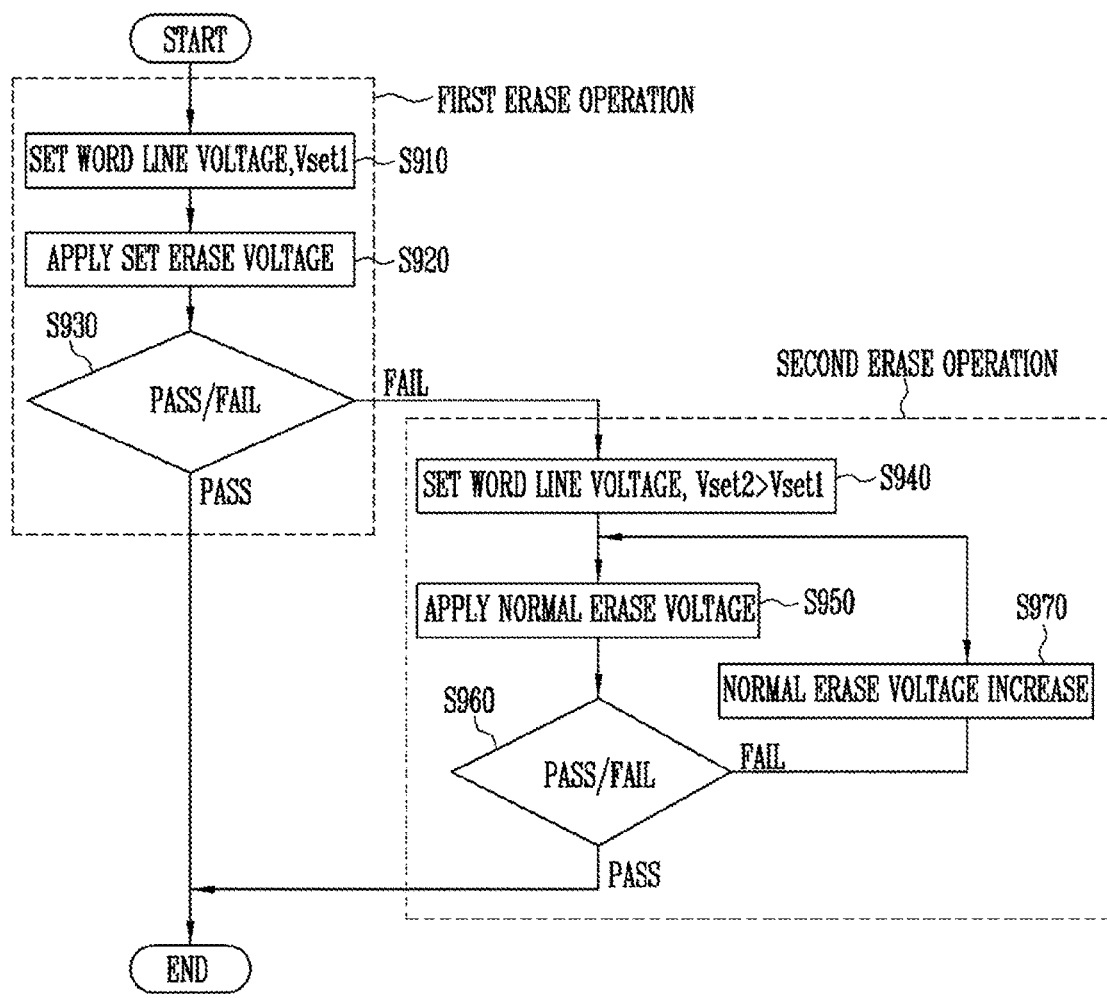
FIG. 9 is a flowchart for describing an erase operation according to an embodiment of the present disclosure.

In the embodiment of the present disclosure, it was explained by way of example that the operation of applying a set program voltage and verifying a program are performed once during the first program operation, but the operation of applying a set program voltage and of verifying a program may be performed twice or more as illustrated in FIG. 9.

As mentioned, in the embodiment of the present disclosure, the first program operation is performed prior to the second program operation during the program operation, and the potential level of the program allowable voltage applied to the bit line during the first program operation is adjusted to be lower than the potential level of the program allowable voltage applied to the bit line during the second program operation. Accordingly, numerous charges may be stored in the memory cells during the first program operation. Then, when the second program operation is performed in the Increment Step Pulse Program (ISPP) method, even if a small number of charges are tunneled to the memory cells during the initial program voltage application of the second program operation, the threshold voltage distribution of the memory cell is improved by the charges stored in the memory cell during the first program operation. Furthermore, the threshold voltage distribution of the memory cells having a wider distribution after the first program operation will have a narrower threshold voltage distribution by the second program operation in the ISPP method.

FIG. 9 is a flowchart for explaining an erase operation according to an embodiment of the present disclosure.

Figure 10:
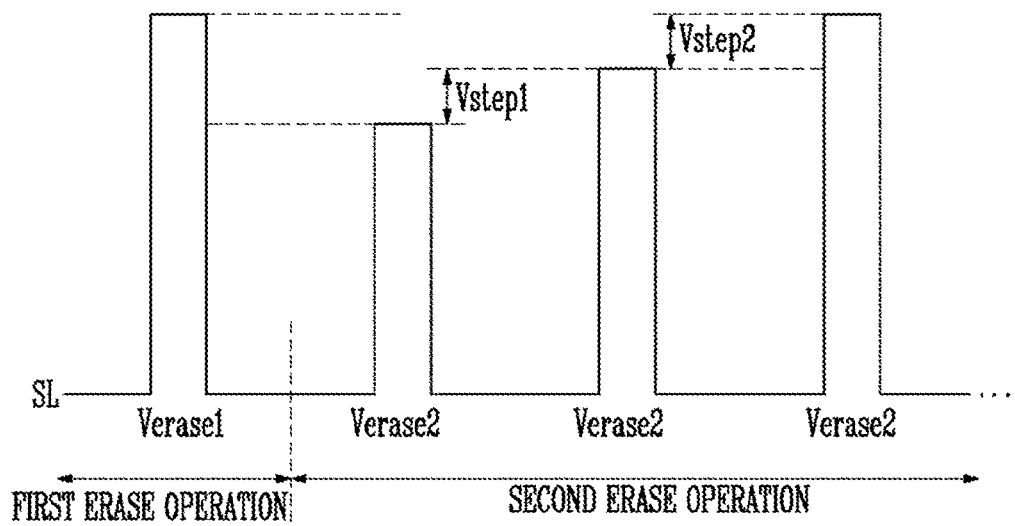
FIG. 10 is a voltage waveform diagram for describing a method of applying an erase voltage according to an embodiment of the present disclosure.

FIG. 10 is a waveform diagram for describing a method for applying an erase voltage according to an embodiment of the present disclosure.

Figure 11:
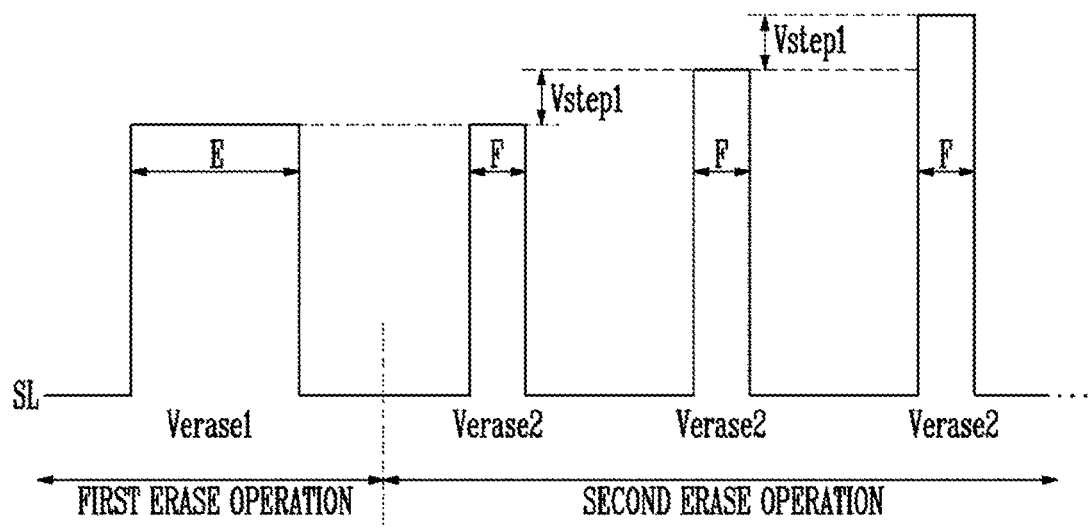
FIG. 11 is a voltage waveform diagram for describing a method of applying an erase voltage according to another embodiment of the present disclosure.

FIG. 11 is a voltage waveform diagram for describing a method for applying an erase voltage according to another embodiment of the present disclosure.

Figure 12:
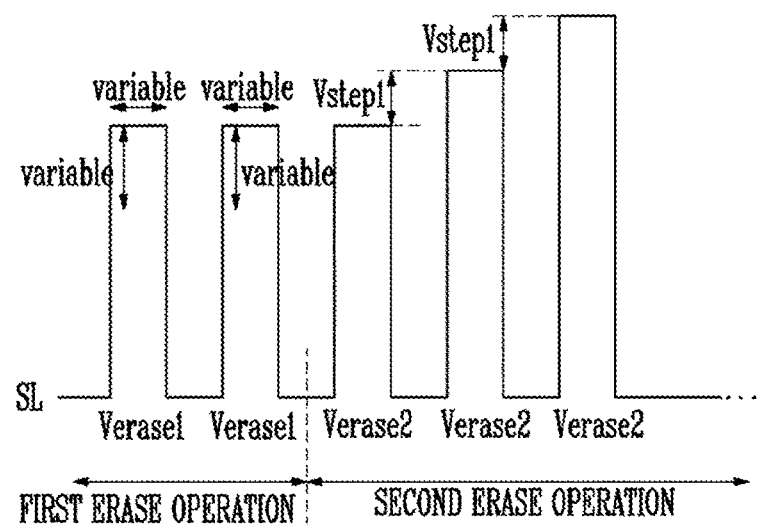
FIG. 12 is a voltage waveform diagram for describing a method of applying an erase voltage according to another embodiment of the present disclosure.

FIG. 12 is a voltage waveform diagram for describing a method for applying an erase voltage according to another embodiment of the present disclosure.

Hereinafter, an erase method of a semiconductor memory device according to an embodiment of the present disclosure will be explained with reference to FIGS. 1 to 4, and 9 to 12.

An erase operation of a semiconductor memory device according to an embodiment of the present disclosure may be divided into a first erase operation and second erase operation.

The first erase operation includes a step of setting a word line voltage (S910), a step of applying a set erase voltage (S920), and a step of verifying an erase (S930).

1) Setting a Word Line Voltage (S910)

When a command (CMD) for an erase operation is input from outside the control logic 140, the control logic 140 sets the voltage applied to the word lines (WL) of the memory block selected during the erase voltage application operation as a first erase control voltage (Vset1). It is desirable that the first erase control voltage (Vset1) has a lower potential level than a second erase control voltage (Vset2). The second erase control voltage (Vset2) may be used during the normal erase voltage application operation during the second erase operation, which will be explained later on. Herein, the first erase control voltage (Vset1) may be a negative voltage.

2) Applying a Set Erase Voltage (S920)

The control logic 140 controls the voltage generator 150 to generate a set erase voltage (Verase1). The set erase voltage (Verase1) generated in the voltage generator 150 is applied to a source line (SL) of the memory cell array 110.

The set erase voltage (Verase1) applied to the source line (SL) during the first erase operation may have a higher potential level than the first normal erase voltage (Verase2) applied during the second erase operation as illustrated in FIG. 10.

Furthermore, as illustrated in FIG. 11, the application time (E) of the set erase voltage (Verase1) applied during the first erase operation may be longer than the application time (F) of the first normal erase voltage (Verase2) applied during the second erase operation.

Furthermore, as illustrated in FIG. 12, it is possible to vary the potential level and application time of the set erase voltage (Verase1) applied during the first erase operation such that at least one of the potential level is higher and the application time is longer than the first normal erase voltage (Verase1) applied during the second erase operation.

When the set erase voltage (Verase1) is applied to the source line (SL) of the memory cell array 110, the voltage generator 150 generates the first control voltage (Vset1) set at the step of setting a word line voltage (S910), and the address decoder 120 applies the first control voltage (Vset1) to the selected word lines (WL) of the memory block.

3) Verifying Erase (S930)

When the step of applying a set erase voltage (S920) is completed, the control logic 140 controls the voltage generator 150 to generate a verify voltage (Vverify). The verify voltage (Vverify) generated in the voltage generator 150 is applied to the plurality of word lines (WL) by the address decoder 120.

While the verify voltage (Vverify) is applied, the plurality of page buffers (PB1~PBm) sense the potential levels of the corresponding bit lines (BL1~BLm) and perform an erase verifying operation.

The second erase operation includes a step of setting a word line voltage (S940), a step of applying a normal erase voltage (S950), a step of verifying an erase (S960), and a step of increasing a normal erase voltage (S970).

4) Setting Word Line Voltage (S940)

When a result of the step of verifying an erase of the first erase operation (S930) is determined as a failure, the control logic 140 sets the voltage applied to the word lines of the memory block selected during the erase voltage application operation as a second erase control voltage (Vset2). It is desirable that the second erase control voltage (Vset2) has a higher potential level than the first erase control voltage (Vset1).

5) Applying Normal Erase Voltage (S950)

The control logic 140 controls the voltage generator 150 to generate a normal erase voltage (Verase2). The normal erase voltage (Verase2) generated in the voltage generator 150 is applied to a source line (SL) of the memory cell array 110. Herein, the generated normal erase operation (Verase2) may have at least one of a lower potential level or shorter voltage application time than the set erase voltage (Verase1) generated during the first erase operation aforementioned.

Herein, the voltage generator 150 generates the second erase control voltage (Vset2) set at the step of setting a word line voltage (S940), and the address decoder 120 applies the second erase control voltage (Vset2) to the word lines (WL) of the memory block selected.

6) Verifying Erase (S960)

When the step of applying a normal erase voltage (S950) is completed, the control logic 140 controls the voltage generator 150 to generate a verify voltage (Vverify). The verify voltage (Vverify) generated in the voltage generator 150 is applied to the plurality of word lines of the memory block selected by the address decoder.

While the verify voltage (Vverify) is applied, the plurality of page buffers (PB1~PBm) sense the potential levels of the corresponding bit lines (BL1~BLm) and perform the verifying operation.

7) Increase of Normal Erase Voltage (S970)

When a result of the aforementioned step of verifying an erase (S960) fails, the control logic 140 sets a new normal erase voltage (Verase2) that is increased by as much as a step voltage (Vstep1) over the normal erase voltage (Verase2) used in the previous step of applying a normal erase voltage (S950). The control logic 140 controls the peripheral circuit 180 to re-perform starting from the step of applying a normal erase voltage (S950). As such, the normal erase voltage (Verase2) is sequentially applied the source line (SL).

In the embodiments of the present disclosure, it was explained by way of example that the operation of applying a set erase voltage and the operation of verifying erase are performed once during the first erase operation, but the operation of applying a set erase voltage and the operation of verifying an erase may be performed twice or more as in shown FIG. 12.

As mentioned, according to the embodiments of the present disclosure, during an erase operation of the semiconductor memory device, a first erase operation is performed before a second erase operation, and at least one of the potential level and the application time of the erase voltage used in the first erase operation are adjusted such that more charges can flow out of the memory cells than when the first erase voltage of the second erase operation is applied.

Then, when the second erase operation is performed in the Incremental Step Pulse Erase (ISPE) method, even when a small number of charges flow out of the memory cells when the initial program voltage is applied during the second erase operation, the threshold voltage distribution of the memory cell is improved by the charges that flew out from the memory cell during the first erase operation. Furthermore, the threshold voltage distribution of the memory cells having a wider distribution after the first erase operation will have a narrower width of threshold voltage distribution by the second erase operation in the ISPE method.

Figure 13:
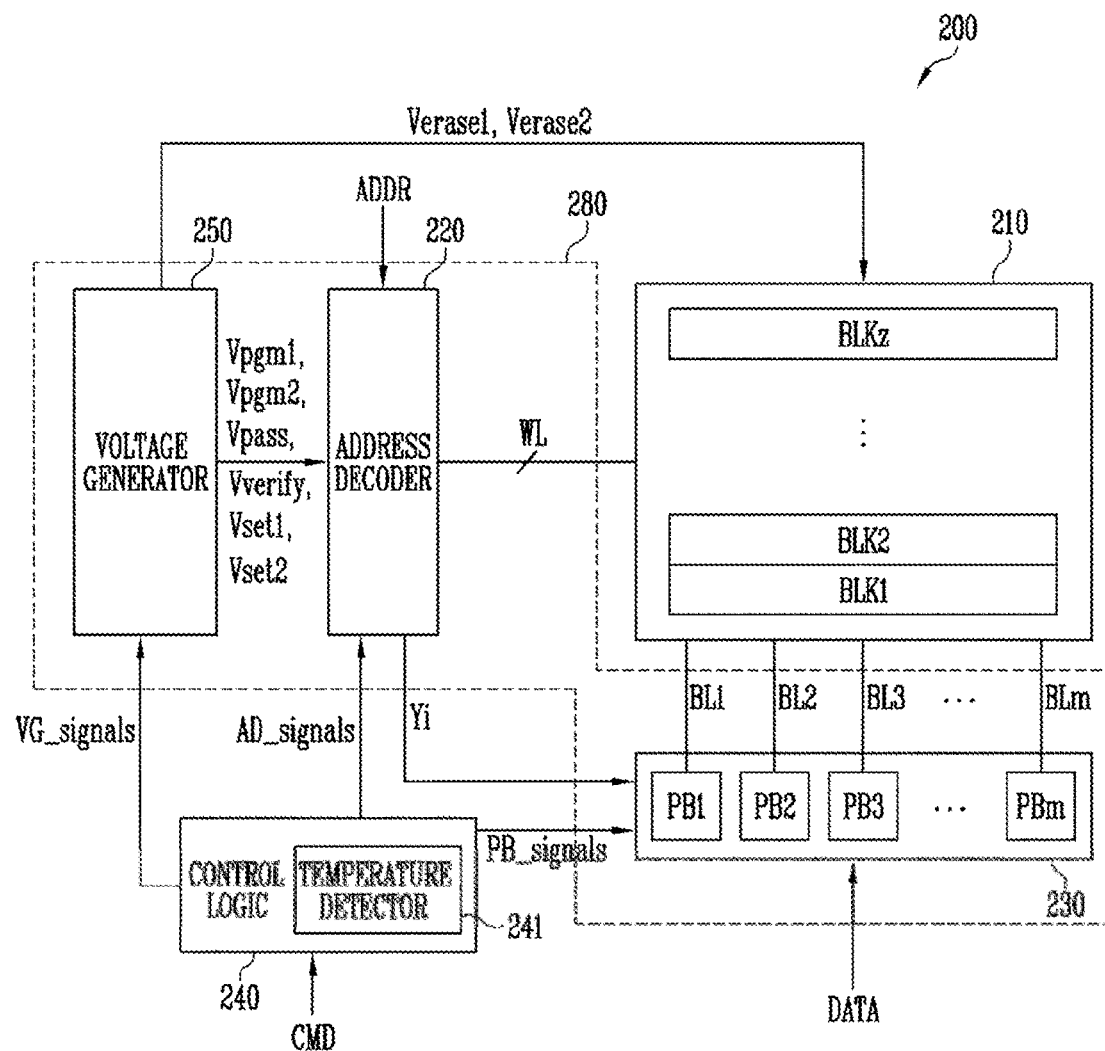
FIG. 13 is a block diagram for describing a semiconductor memory device according to an embodiment of the present disclosure.

FIG. 13 is a block diagram for describing a semiconductor memory device according to another embodiment of the present disclosure.

Referring to FIG. 13, the semiconductor memory device 200 includes a memory cell array 210, address decoder 220, reading and writing circuit 230, control logic 240, and voltage generator 250.

The memory cell array 210, address decoder 220, reading and writing circuit 230, and voltage generator 250 of the semiconductor memory device 200 are configured the same as and operate the same as the memory cell array 110, address decoder 120, reading and writing circuit 130, and voltage generator 150 of the semiconductor memory device 100 illustrated in FIG. 1. Therefore, detailed explanation thereof will be omitted.

The control logic 240 is connected to the address decoder 220, reading and writing circuit 230, and voltage generator 250. The control logic 240 receives a command (CMD) through an input/output buffer (not illustrated) of the semiconductor memory device 200. The control logic 240 is configured to control the overall operations of the semiconductor memory device 200 in response to a command (CMD).

The control logic 240 may be configured to include a temperature detector 241. The temperature detector 241 measures a current temperature of the semiconductor memory device 200 and detects when the current temperature is higher than a predetermined temperature. Furthermore, the temperature detector 241 may compare the current temperature of the semiconductor memory device 200 with the predetermined temperature, and detect a difference between the current temperature and the predetermined temperature.

The control logic 240 controls the reading and writing circuit 230 such that the program allowable voltage applied to one or more of the bit lines (BL1~BLm) during the first program operation of the program operation is lower than the program allowable voltage applied to one or more of the bit lines (BL1~BLm) during the second program operation. Further, the control logic 240 may control the reading and writing circuit 230 so that in one embodiment the second program operation is performed after the first program operation.

Furthermore, the control logic 240 controls the voltage generator 250 such that the set program voltage (Vpgm1) generated during the first program operation of the program operation has at least one of a higher potential level or longer application time than the first normal program voltage (Vpgm2) of the second program operation.

In the semiconductor memory device 200, the higher the temperature, the higher the threshold voltage distribution is set during the program operation. Therefore, the first normal program voltage (Vpgm2) of the second program operation must be set sufficiently low so as to uniformly program the threshold voltage distribution.

Therefore, the control logic 240 may adjust a difference between the program allowable voltage of the first program operation and the program allowable voltage of the second program operation according to a difference between the current temperature and predetermined temperature detected through the temperature detector 241 during the program operations. Furthermore, the control logic 240 may control the peripheral circuit 280 to adjust at least one of the potential level or application time of the set program voltage (Vpgm1) applied to the memory cell array 210 during the first program operation according to a difference between the current temperature and the predetermined temperature detected through the temperature detector 241 during the first program operation. For example, when the current temperature of the semiconductor memory device 200 is higher than the predetermined temperature, the greater the difference between the current temperature and the predetermined temperature, the control logic 240 may reduce a difference between the program allowable voltage of the first program operation and the program allowable voltage of the second program operation, and reduce at least one of the potential level or application time of the set program voltage (Vpgm1) generated during the first program operation.

Furthermore, the control logic 240 controls the voltage generator 250 such that the first erase control voltage (Vset1) applied to the word lines (WL) during the first erase operation is lower than the second erase control voltage (Vset2) applied to the word lines (WL) during the second erase operation. The control logic 240 controls the voltage generator such that the set erase voltage (Verase1) applied to the source line of the memory cell array 210 during the first erase operation has at least one of a higher potential level or longer application time than the first normal erase voltage (Verase2) of the second erase operation.

The program operation method and erase operation method of the semiconductor memory device 200 are similar to that explained with reference to FIG. 5 and FIG. 9. According to a difference between the current temperature and predetermined temperature detected by the temperature detector 241 during the program operation, a difference between the program allowable voltage of the first program operation and the second program operation and the potential level or application time of the set program voltage (Vpgm1) generated during the first program operation may be adjusted to perform the program operation.

Figure 14:
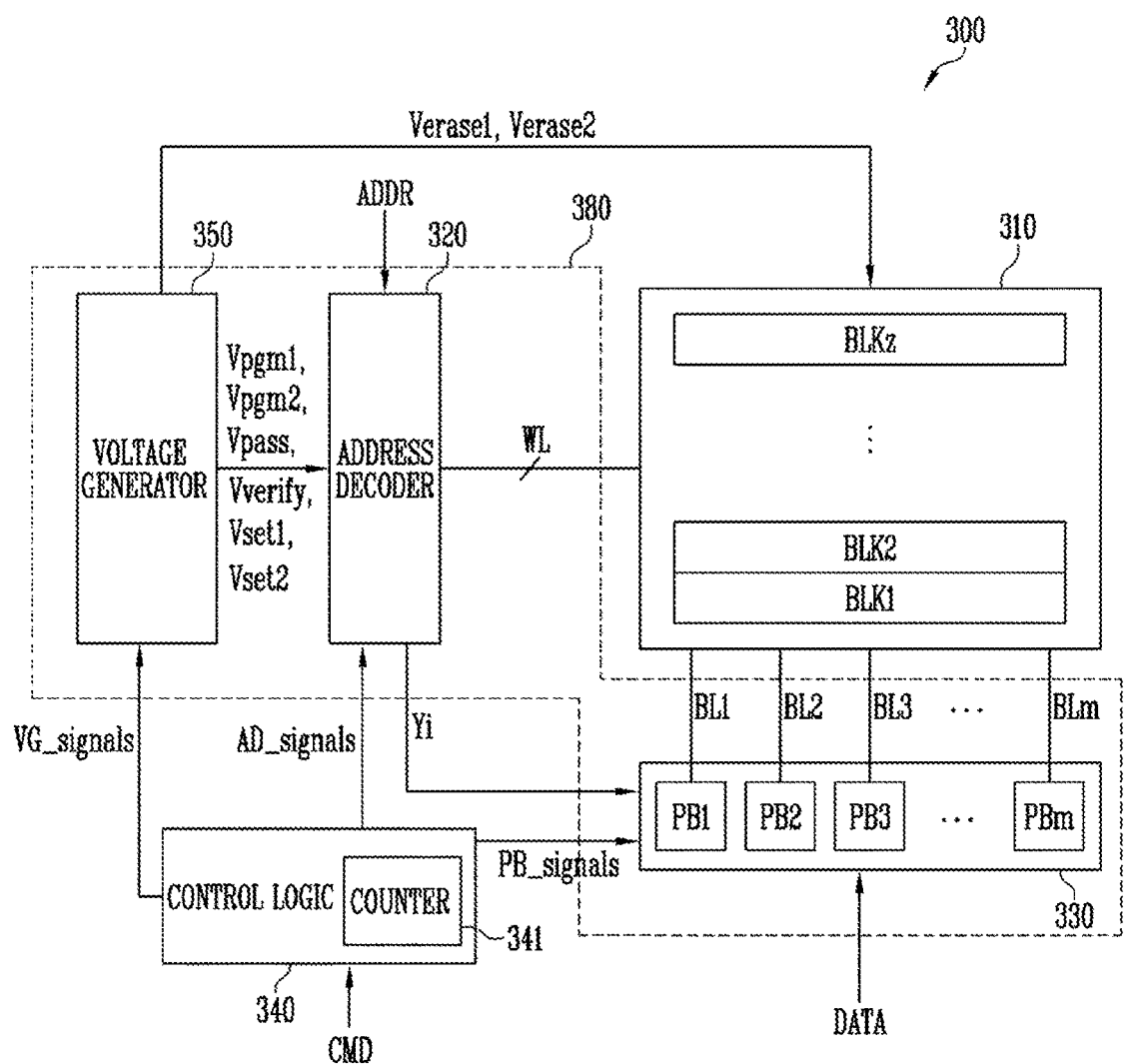
FIG. 14 is a block diagram for describing a semiconductor memory device according to an embodiment of the present disclosure.

FIG. 14 is a block diagram for explaining a semiconductor memory device according to another embodiment of the present disclosure.

Referring to FIG. 14, the semiconductor memory device 300 includes a memory cell array 310, address decoder 320, reading and writing circuit 330, control logic 340, and voltage generator 350.

The memory cell array 310, address decoder 320, reading and writing circuit 330, and voltage generator 350 of the semiconductor memory device 300 are configured the same and operate the same as the memory cell array 110, address decoder 120, reading and writing circuit 130, and voltage generator 150 of the semiconductor memory device 100 illustrated in FIG. 1. Therefore, detailed explanation thereof is omitted.

The control logic 340 is connected to the address decoder 320, reading and writing circuit 330, and voltage generator 350. The control logic 340 receives a command (CMD) through an input/output buffer (not illustrated) of the semiconductor memory device 300. The control logic 340 is configured to control the overall operations of the semiconductor memory device 300 in response to the command (CMD).

The control logic 340 may be configured to include a counter 341. The counter 341 counts the number of program/erase cycles of the semiconductor memory device 300 and detects a case where a predetermined count is higher than a current count. Furthermore, the counter 341 may compare a current count of program/erase cycles and the predetermined count, and detect a difference between the current count and the predetermined count.

The control logic 340 controls the reading and writing circuit 330 such that the first program allowable voltage applied to bit lines (BL1~BLm) during the first program operation is lower than the second program allowable voltage applied to one or more of the bit lines (BL1~BLm) during the second program operation.

Furthermore, the control logic 340 controls the voltage generator 350 such that the set program voltage (Vpgm1) generated during the first program operation has at least one of a higher potential level or longer application time than the first normal program voltage (Vpgm2) of the second program operation.

The more times the program/erase cycle is performed, the higher the semiconductor memory device threshold voltage distribution is programmed during the program operation. Therefore, the first normal program voltage (Vpgm2) of the second program operation must be set sufficiently low to uniformly program the threshold voltage distribution.

Therefore, the control logic 340 may adjust the difference between the program allowable voltage of the first program operation and the program allowable voltage of the second program operation according to the difference between the count of the program/erase and the predetermined count detected by the counter 341 during the program operation. Furthermore, the control logic 340 may control the peripheral circuit 380 to adjust at least one of the potential level or application time of the set program voltage (Vpgm1) applied to the memory cell array 310 during the first program operation according to a difference between the count of the program/erase and the predetermined count detected through the counter 341 during the program operation. For example, when the current count of the program/erase of the semiconductor memory device 200 is higher than the predetermined count, the greater the difference between the current count of the program/erase and the predetermined count, the control logic 340 may reduce the difference between the program allowable voltage of the first program operation and the program allowable voltage of the second program operation. The control logic 340 may also reduce the potential level or application time of the set program voltage (Vpgm1) generated during the first program operation.

Furthermore, the control logic 340 controls the voltage generator 350 such that the first erase control voltage (Vset1) applied to the word lines (WL) during the first erase operation is lower than the second erase control voltage (Vset2) applied to the word lines (WL) during the second erase operation. The control logic 340 controls the voltage generator such that the set erase voltage (Verase1) being to the source line of the memory cell array 310 during the first erase operation has at least one of a higher potential level or longer application time than the first normal erase voltage (Verase2) of the second erase operation.

The program operation method and erase operation method of the semiconductor memory device 300 are similar to that explained with reference to FIG. 5 and FIG. 9. According to the difference between the current count of the program/erase and the predetermined count detected by the counter 341 during the program operation, the difference between the program allowable voltage of the first program operation and the program allowable voltage of the second program operation and the potential level or application time of the set program voltage (Vpgm1) being generated during the first program operation may be adjusted to perform the program operation.

Figure 15:
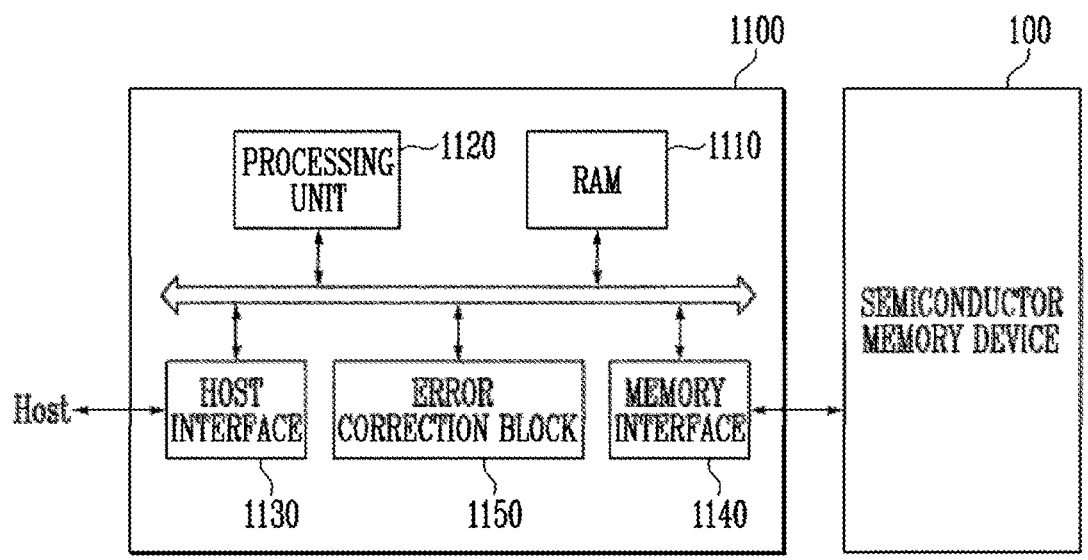
FIG. 15 is a block diagram illustrating a memory system that includes the semiconductor memory device of FIG. 1, or FIG. 13, or FIG. 14.

FIG. 15 is a block diagram illustrating a memory system including the semiconductor memory device of FIG. 1, FIG. 13 or FIG. 14. For convenience of explanation, an embodiment including the semiconductor memory device 100 of FIG. 1 will be explained.

Referring to FIG. 15, the memory system 1000 includes a semiconductor memory device 100 and controller 1100.

The semiconductor memory device 100 may be configured and operate as explained in FIG. 1, and a detailed explanation thereof will be omitted.

The controller 1100 is connected to the host and semiconductor memory device 100. The controller 1100 is configured to access the semiconductor memory device 100 in response to a request from the host. For example, the controller 1100 is configured to control reading, writing, erasing, and background operations of the semiconductor memory device 100. The controller 1100 is configured to provide an interface between the semiconductor memory device 100 and host. The controller 1100 is configured to drive firmware for controlling the semiconductor memory device 100.

The controller 1100 includes a RAM (Random Access Memory) 1110, processing unit 1120, host interface 1130, memory interface 1140, and error correction block 1150. The RAM 1110 is used as at least one of an operating memory of the processing unit 1120, a cache memory between the semiconductor memory device 100 and host, and a buffer memory between the semiconductor memory device 100 and host. The processing unit 1120 controls the overall operations of the controller 1100. Furthermore, the controller 1100 may temporarily store program data being provided from the host during a writing operation.

The host interface 1130 includes a protocol for performing data exchange between the host and controller 1100. In an embodiment, the controller 1100 is configured to communicate with the host through at least one of various interface protocols such as a USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol, SCSI (small computer small interface) protocol, ESDI (enhanced small disk interface) protocol, IDE (Integrated Drive Electronics) protocol, and private protocol.

The memory interface 1140 performs interfacing with the semiconductor memory device 100. For example, the memory interface includes a NAND interface or NOR interface.

The error correction block 1150 is configured to detect and correct an error in the data received from the semiconductor memory device 100 using an error correcting code (ECC). The processing unit 1120 may adjust a reading voltage according to a result of error detection of the error correction block 1150, and control the semiconductor memory device 100 to perform a re-reading. In an embodiment, the error correction block may be provided as a component of the controller 1100.

The controller 1110 and semiconductor memory device 100 may be integrated into one semiconductor device. In an embodiment, the controller 1100 and semiconductor memory device 100 may be integrated into one semiconductor device and form a memory card. For example, the controller 1100 and semiconductor memory device 100 may be integrated into one semiconductor device, and form a memory card such as a PC card (PCMCIA, personal computer memory card international association), compact flash card (CF), smart media card (SM, SMC), memory stick, multimedia card (MMC, RS-MMC, MMCmicro), SD card (SD, miniSD, microSD, SDHC), and universal flash memory device (UFS) and the like.

The controller 1100 and semiconductor memory device 100 may be integrated into one semiconductor device and form a semiconductor drive (SSD, Solid State Drive). The semiconductor drive (SSD) includes a storage device configured to store data in a semiconductor memory. When the memory system 1000 is used as a semiconductor drive (SSD), the operating speed of the host connected to the memory system 1000 is significantly improved.

In another example, the memory system 1000 is provided as a computer, UMPC (Ultra Mobile PC), workstation, net-book, PDA (Personal Digital Assistants), portable computer, web tablet, wireless phone, mobile phone, smart phone, e-book, PMP (portable multimedia player), smart phone, e-book, PMP (portable multimedia player), portable game, navigation device, black box, digital camera, 3-dimensional television, digital audio recorder, digital audio player, digital picture recorder, digital picture player, digital video recorder, digital video player, a device configured to transmit and receive transceiver information in a wireless environment, one of various electronic devices that form a home network, one of various electronic devices that form a computer network, one of various electronic devices that form a telematics network, RFID device, or one of various components that form a computing system.

In an embodiment, the semiconductor memory device 100 or memory system 1000 may be packaged in various formats. For example, the semiconductor memory device 100 or memory system 1000 may be packed by a method of a PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOP), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP) and be mounted.

Figure 16:
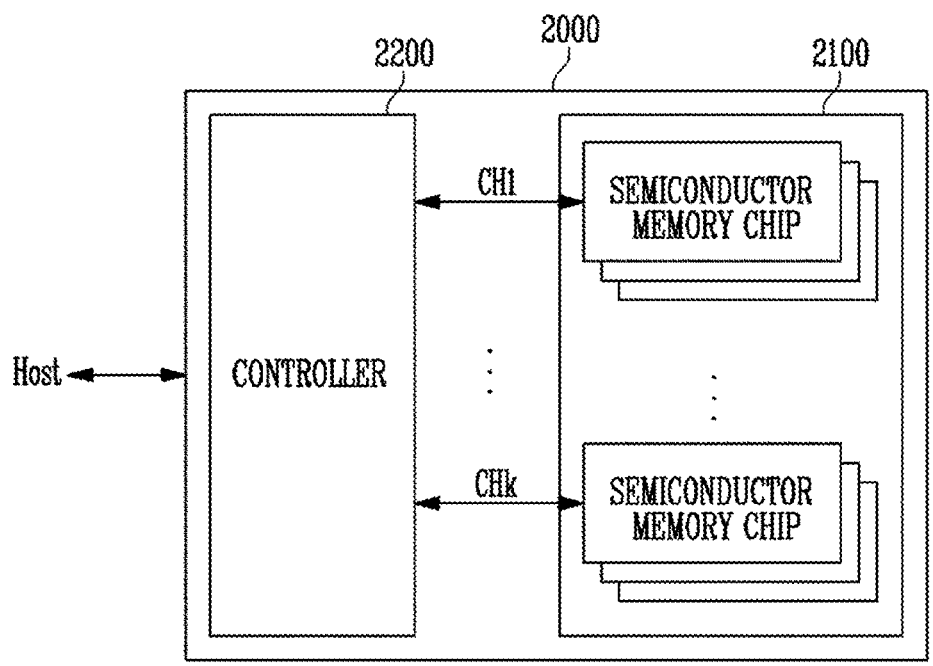
FIG. 16 is a block diagram illustrating an application example of the memory system of FIG. 15.

FIG. 16 is a block diagram illustrating an application example of the memory system of FIG. 15.

Referring to FIG. 16, the memory system 2000 includes a semiconductor memory device 2100 and controller 2200. The semiconductor memory device 2100 includes a plurality of semiconductor memory chips. The plurality of semiconductor memory chips are divided into a plurality of groups.

In FIG. 16, it is illustrated that the plurality of groups communicate with the controller 2200 through a first to $k^{th}$ channels (CH1~CHk). Each semiconductor memory chip may be configured and operate the same as one of the semiconductor memory devices 100, 200, 300 explained with reference to FIG. 1, 13, or 14.

Each group is configured to communicate with the controller 2200 through one common channel. The controller 2200 is configured the same as the controller 1100 explained with reference to FIG. 15, and is configured to control the plurality of memory chips of the semiconductor memory device 2100 through the plurality of channels (CH1~CHk).

Figure 17:
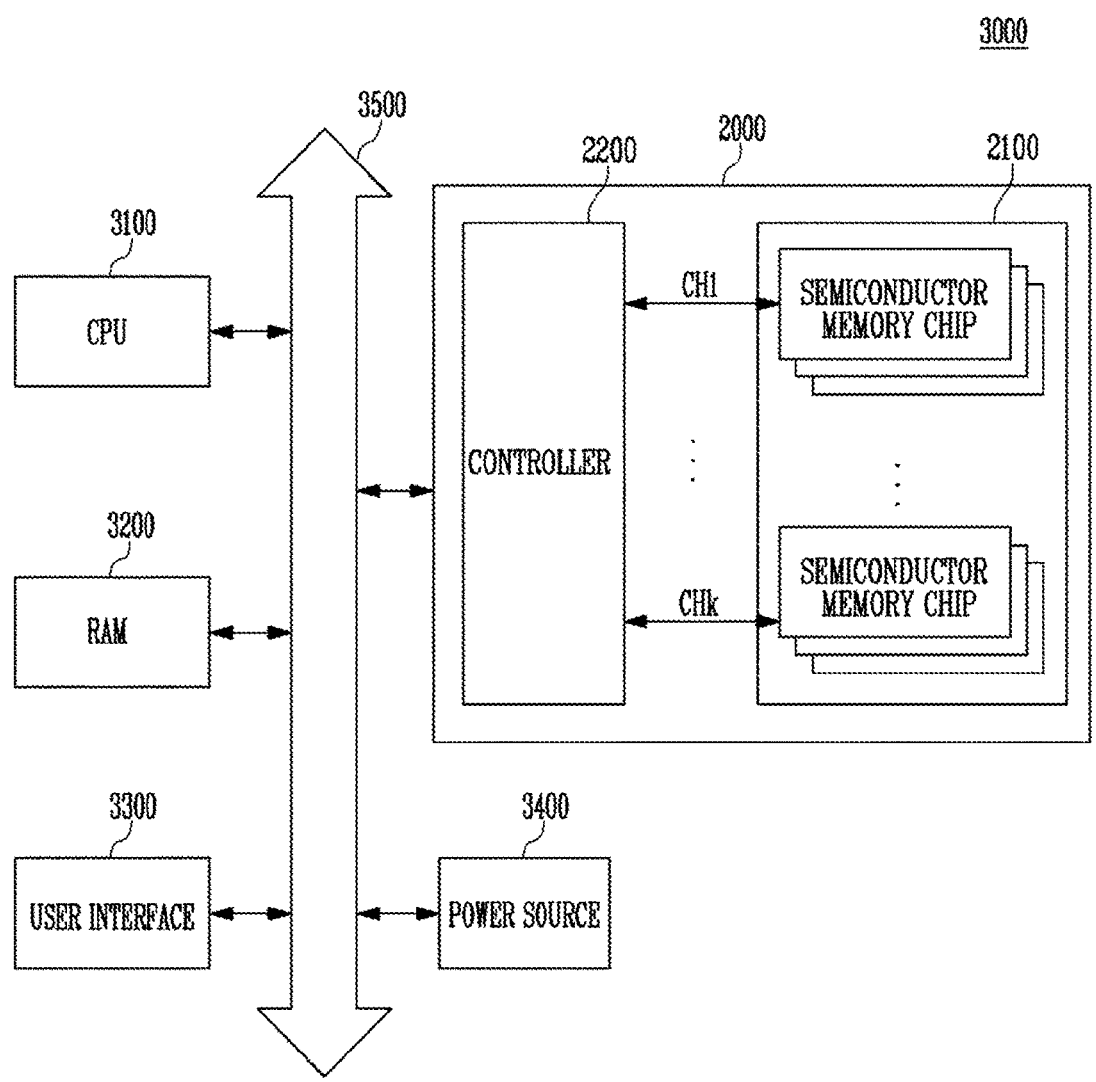
FIG. 17 is a block diagram illustrating a computing system that includes the memory system described with reference to FIG. 16.

FIG. 17 is a block diagram illustrating a computing system including the memory system explained with reference to FIG. 16.

Referring to FIG. 17, the computing system 3000 includes a CPU 3100, RAM (Random Access Memory) 3200, user interface 3300, power source 3400, system bus 3500, and memory system 2000.

The memory system 2000 is electrically connected to the CPU 3100, RAM 3200, user interface 3300, and power source 3400 through the system bus 3500. The data provided through the user interface 3300 or processed by the CPU 3100 is stored in the memory system 2000.

In FIG. 17, it is illustrated that the semiconductor memory device 2100 is connected to the system bus 3500 through the controller 2200. However, the semiconductor memory device 2100 may be configured to be directly connected to the system bus 3500. Herein, functions of the controller 2200 will be performed by the CPU 3100 and RAM 3200.

FIG. 17, illustrates the memory system 2000 explained with reference to FIG. 16. However, the memory system 2000 may be substituted with the memory system explained with reference to FIG. 15. In an embodiment, the computing system 3000 may be configured to include both the memory systems 1000, 2000 explained with reference to FIG. 15 and FIG. 16.

In the drawings and specification, there have been disclosed typical exemplary embodiments of the disclosure, and although specific terms are employed, they are used in a generic and descriptive sense only and not for purposes of limitation. As for the scope of the disclosure, it is to be set forth in the following claims. Therefore, it will be understood by those of ordinary skill in the art that various changes in form and details may be made therein without departing from the spirit and scope of the present disclosure as defined by the following claims.

What is claimed is:

1. A semiconductor memory device comprising:
a memory cell array including a plurality of memory cells;
a peripheral circuit configured to perform a program operation or erase operation of the memory cell array; and
a control logic configured to control the peripheral circuit such that a first erase control voltage applied to word lines of the memory cell array during a first erase operation of the erase operation and a second erase control voltage applied to the word lines during a second erase operation of the erase operation are different from each other,
wherein the peripheral circuit comprises a voltage generator configured to generate a set erase voltage to be applied to a source line of the memory cell array during the first erase operation and normal erase voltages to be applied to the source line during the second erase operation, and
wherein the set erase voltage has a longer application time than a first normal erase voltage of the normal erase voltages.

2. The semiconductor memory device according to claim 1,
wherein the control logic controls the peripheral circuit such that a first program allowable voltage applied to bit lines of the memory cell array during a first program operation of the program operation and a second program allowable voltage applied during a second program operation of the program operation are different from each other, and
wherein the first program allowable voltage has a lower potential level than the second program allowable voltage.

3. The semiconductor memory device according to claim 2,
wherein
the voltage generator configured to generate a set program voltage to be applied to word lines of the memory cell array during the first program operation, and normal program voltages to be applied to the word lines during the second program operation, and
wherein the peripheral circuit further comprises:
a reading and writing circuit configured to apply the first program allowable voltage and second program allowable voltage to the bit lines during the first program operation and second program operation.

4. The semiconductor memory device according to claim 3,
wherein the set program voltage has a higher potential level than a first normal program voltage of the normal program voltages.

5. The semiconductor memory device according to claim 3,
wherein the set program voltage has a longer application time than a first normal program voltage of the normal program voltages.

6. The semiconductor memory device according to claim 3,
wherein the voltage generator generates a set program voltage having a different potential level and different application time.

7. The semiconductor memory device according to claim 2,
wherein the first program operation is performed before the second program operation is performed.

8. The semiconductor memory device according to claim 1,
wherein the first erase control voltage has a lower potential level than the second erase control voltage.

9. The semiconductor memory device according to claim 1,
wherein the set erase voltage has a higher potential level than the first normal erase voltage of the normal erase voltages.

10. The semiconductor memory device according to claim 1,
wherein the voltage generator generates a set erase voltage having a different potential level and different application time.

11. The semiconductor memory device according to claim 1,
wherein the first erase operation is performed before the second erase operation is performed.

* * * * *